US00RE37690E

(19) United States
(12) Reissued Patent
Kitano et al.

(10) Patent Number: US RE37,690 E
(45) Date of Reissued Patent: May 7, 2002

(54) LEAD FRAME AND SEMICONDUCTOR DEVICE

(75) Inventors: Makoto Kitano, Tsuchiura; Sueo Kawai, Iwama-machi; Asao Nishimura, Ushiku; Hideo Miura, Tsuchiura; Akihiro Yaguchi, Chiyoda-machi; Chikako van Koten nee Kitabayashi, Kokubunji; Ichio Shimizu, Tamamura-machi; Toshio Hatsuda, Niihari-mura; Toshinori Ozaki, Minori-machi; Toshio Hattori, Ushiku; Souji Sakata, Dezima-mura, all of (JP)

(73) Assignee: Hitachi, Ltd., Tokyo (JP)

(21) Appl. No.: 08/448,881

(22) Filed: May 24, 1995

Related U.S. Patent Documents

Reissue of:
(64) Patent No.: 4,942,452
Issued: Jul. 17, 1990
Appl. No.: 07/158,673
Filed: Feb. 22, 1988

U.S. Applications:

(63) Continuation of application No. 07/914,465, filed on Jul. 17, 1992, now abandoned.

(30) Foreign Application Priority Data

Feb. 25, 1987 (JP) ..... 62-40287
Mar. 13, 1987 (JP) ..... 62-56590

(51) Int. Cl.[7] ..... H01L 23/495
(52) U.S. Cl. ..... 257/666; 257/669; 257/676
(58) Field of Search ..... 257/666, 676; 174/52.4

(56) References Cited

U.S. PATENT DOCUMENTS

| | | | | |
|---|---|---|---|---|
| 4,048,438 | A | * | 9/1977 | Zimmerman |
| 4,523,218 | A | * | 6/1985 | Kato |
| 4,589,010 | A | * | 5/1986 | Tateno et al. |
| 4,797,726 | A | * | 1/1989 | Manabe |

FOREIGN PATENT DOCUMENTS

| | | | |
|---|---|---|---|
| JP | 52-53665 | | 4/1977 |
| JP | 52-95173 | | 8/1977 |
| JP | 53-32672 | | 3/1978 |
| JP | 58-14557 | | 1/1983 |
| JP | 60-118252 | | 8/1985 |
| JP | 60-181051 | | 12/1985 |
| JP | 00-16555 | * | 1/1986 |
| JP | 62-15845 | | 1/1987 |
| JP | 62-40287 | * | 2/1987 |
| JP | 62-56590 | * | 3/1987 |

* cited by examiner

*Primary Examiner*—Sheila V. Clark
(74) *Attorney, Agent, or Firm*—Antonelli, Terry, Stout & Krays, LLP

(57) ABSTRACT

A lead frame and a semiconductor device wherein a through hole is formed in the center of a semiconductor chip-mounting surface of a chip pad at the center of the lead frame, the through hole being tapered or being one which corresponds to a surface area that is greater on the surface of the chip-mounting surface of the chip pad than on the surface of the side opposite to the chip-mounting surface thereof. This prevents the occurrence of cracks in the sealing plastic portion in the step of reflow soldering of the lead frame to the substrate.

48 Claims, 5 Drawing Sheets

LEAD FRAME AND SEMICONDUCTOR DEVICE

Matter enclosed in heavy brackets [ ] appears in the original patent but forms no part of this reissue specification; matter printed in italics indicates the additions made by reissue.

*This application is a continuation of application Ser. No. 07/914,465, filed Jul. 17, 1992, abandoned, which is a reissue application for U.S. Pat. No. 4,942,452, granted Jul. 17, 1990.*

BACKGROUND OF THE INVENTION

1. Field of the Invention

The present invention relates to a lead frame and a semiconductor device. More specifically, the invention relates to a lead frame and a semiconductor device adapted to [preventing] *prevent* package cracking [the heat] as a result of *the heat* generated at the time of reflow soldering.

2. Description of the Prior Art

Plastic molded semiconductor devices of the surface mounted type which permits the leads to be directly soldered onto the substrate are becoming established as a standard substitute for conventional devices of the pin inserted type. If packages of such a type are preserved in a high-temperature and high-humidity environment, the plastic will in time absorb moisture which will then be vaporized in an interface between a chip pad (a portion where the chip is mounted which hereinafter is referred to as chip pad) and the plastic portion at the time of heating for soldering (reflow), giving rise to the formation of cracks in the lower corner surface of the chip pad. The cracks develop at the time of reflowing the solder and are usually called reflow cracks.

According to a conventional technique for preventing the reflow cracks from occurring, the back surface of the package is *perforated* for allowing any vapor generated to escape as is disclosed in Japanese Patent Laid-Open No. 208847/1985.

In order to increase the adhering strength on the interface between the plastic portion and the chip pad while preventing the formation of a gap, furthermore, a method has been proposed according to which the surface of the chip pad opposite to the surface on which the chip is mounted is made rugged as disclosed in Japanese Patent Laid-Open Nos. 199548/1983 and 186044/1965. A technique for perforating a portion that corresponds to the chip pad has also been disclosed in Japanese Patent Laid-Open No. 16357/1984 and in U.S. Pat. No. 4,633,583.

Among the above-mentioned conventional techniques, the method of perforating the lower surface of the package helps prevent the formation of reflow cracks but forms a passage that allows the moisture to flow between the exterior and interior of the package which then results in the corrosion of chip electrodes.

The method which forms a rugged surface on the surface of the chip pad opposite to the chip-mounting surface is effective for preventing the displacement between the chip pad and the adhering surface of the plastic portion, but is not effective for preventing the displacement in a direction in which they will be separated away from each other since the plastic portion easily escapes from the recessed portion.

The moisture contained in the plastic vaporizes at the time of reflow soldering of the plastic molded semiconductor device, and the vapor pressure acts on the voids in the interface between the chip pad and the plastic or acts on the cavities in the non-adhered portions to promote the [peelng] *peeling* on the interface between the chip pad and the plastic. Even if the cavity becomes progressively larger as a result of peeling, the ambient water content is supplied thereto by diffusion. Therefore, the pressure in the cavity does not decrease, and the plastic portion undergoes deformation giving rise to the formation of cracks starting from a portion where a maximum stress generates at the end of the chip pad (see crack 10 in FIG. 6). According to the above-mentioned Japanese Patent Laid-Open No. 16357/1984, part of the chip pad is removed and plastic is filled in this portion to prevent the peeling by the thermal stress. Moreover, since the thickness of the plastic portion increases equivalently, resistance against the humidity can be improved to some extent. However, stress in the portion where a maximum stress develops is little different from the case of when a portion of the chip pad is not removed because of the deformation that develops when the plastic portion is peeled off from the chip pad being caused by the vapor pressure at the time of reflow soldering. Therefore, this structure is not very effective for coping with the cracks that develop in the plastic portion at the time of reflow soldering.

In order to prevent the chip from breaking at the time of die bonding or in the subsequent temperature aging, it had [nitherto] *hitherto* been attempted to use a lead frame material having a small coefficient of expansion or to use a die bonding agent having a small coefficient of elasticity. However, the traditional methods limited the range for selecting the materials, pushed up the manufacturing cost, and were not completely effective for suppressing the reflow cracks.

The dimple processing is effective for preventing the development of cracks in the plastic portion at the lower end of the chip pad under the temperature cycle testing. However, when there exists a large difference in the linear thermal expansion coefficient between the lead frame material and the plastic material, the cracks easily develop at the root of the resinous protrusion filled in the dimples.

According to the [performation] *perforation* method which forms apertures that reach from the surface of the package to the side of the chip pad opposite to the chip mounting [side] *surface* in order to suppress the reflow cracks, the moisture easily reaches the interface where the chip pad and the plastic part are adhered together and further reaches the surface of the chip through apertures. When used for extended periods of time, therefore, the device becomes defective as the aluminum ([A1] *Al*) wiring is corroded. Further, this method is not quite effective for suppressing the development of cracks in the plastic at the lower end of the chip pad caused by the temperature cycle.

SUMMARY OF THE INVENTION

[The] *An* object of the present invention is to prevent the reflow cracks resulting from vapor pressure.

Another object of the present invention is to provide semiconductor device which permits minimum destruction of the semiconductor chips at the time of die bonding or in the subsequent temperature aging, which prevents cracks from developing in the plastic at the lower end of the chip pad even under the temperature cycling test, and which exhibits increased resistance against the reflow cracks.

The above [object is] *objects are* achieved by forming a through hole of a particular shape in the chip pad, and holding a plastic portion on the chip pad utilizing the hole, to thereby decrease the stress that generates in the plastic portion on the lower corner surface of the chip pad where reflow cracks may develop.

To prevent the cracks from developing in the plastic at the time of reflow[,] soldering, it is essential that excessive stress is not generated at an end of the chip pad where maximum stress *is* generated even when the plastic portion is peeled off from the chip pad. This requirement is achieved by a structure which is capable of preventing the *plastic* portion from deforming even when there exists no adhesive force between the plastic portion and the chip pad, i.e., by a structure which does not permit the plastic portion to [escape] *be deformed away* from the chip pad irrespective of the vapor pressure.

A first [invention] *inventive* aspect of the present application is concerned with a unitary structure including a lead frame consisting of a chip pad for mounting a semiconductor chip and a group of leads [connected to said chip pad along the periphery thereof], the improvement wherein a through hole is formed in at least one place of the chip pad, [said] *the* through hole having a tilted portion (tapered portion) with respect to the chip-mounting surface of the chip pad.

The through hole may assume the form in which the entire hole is tilted relative to the direction of thickness of the chip pad or be in the form in which the hole as a wedge portion in the thickness of the chip pad, or may assume any other form.

A second inventive aspect of the present [application] *invention* is concerned with a unitary structure including a lead frame consisting of a chip pad for mounting a semiconductor [element] *chip* and a group of leads [connected to said chip pad along the periphery thereof], the improvement wherein a through hole is formed in at least one location of the chip pad, [said] *the* through hole having an opening [on] *end disposed in* the chip-mounting [side corresponding to] *surface and having* an area that is greater than an area of a hole opening *end* thereof on the side opposite to the chip-mounting [side] *surface*.

A third inventive aspect of the present [application] *invention* is concerned with a semiconductor device which comprises a semiconductor chip, a unitary structure of a chip pad for mounting the semiconductor chip and a group of leads [connected to the chip pad along the periphery thereof], and a plastic portion for sealing inner lead portions [in] *of* the group of leads, the chip pad and the semiconductor chip, wherein a through hole is formed in at least one portion of the chip pad, said through hole having a portion that is tilted relative to the chip-mounting surface of the chip pad.

The through hole may assume the form in which the entire hole is tilted relative to the direction of thickness of the chip pad, the form in which a wedge portion is formed in the [direction of] thickness of the chip pad, the form in which the area of the hole opening [on] *end in* the chip-mounting [side] *surface* is greater than the area of the hole opening [on] *end in* the [side] *surface* opposite to the chip-mounting [side] *surface*, or it may assume another form.

Throughout the first to third mentioned inventive aspects of the present application, it is desired that the through hole has [an] *a first opening end* area [on] *in* the chip-mounting [side] *surface* which [lies from 24% of the area of the chip pad on the side of the chip-mounting surface through up to] *is less than* 80% of the junction area between the chip pad and the chip. It is further desired to form a groove that surrounds the through hole [on the side of] *opening end in* the chip-mounting surface of the chip pad.

Furthermore, the above-mentioned objects are *also* achieved by using a lead frame in which the chip pad is comprised of an adhesive-mounting portion, a chip support portion and a lead for connecting both of them together, and by adhering the chip pad and the semiconductor chip together in the adhesive-mounting portion only.

A fourth inventive aspect of the present [application] *invention* is concerned with a semiconductor device which comprises a semiconductor chip, a chip pad for mounting the semiconductor chip, and a group of leads that include a chip [pad-hanging] *pad supporting* lead ([chip-mounting portion, i.e.,] a lead-like support member for supporting the chip pad which is hereinafter referred to as chip [pad-hanging] *pad supporting* lead) that is linked to the chip pad, wherein the chip pad [is divided into a] *has an outer* peripheral [annular] portion and a central island portion, the island portion is connected to a [portion] *part* of the [annular] *peripheral* portion as a unitary structure so that [it] *the island portion* is supported by the [annular] *peripheral* portion, and the semiconductor [elment] *chip* is indirectly mounted on the [island] *chip* portion via an adhesive and is further mounted on the [element-mounting] *chip mounting* surface of the [annular] *peripheral* portion directly or via a gap (space).

A fifth inventive aspect of the present [application] *invention* is concerned with a semiconductor device having a component structure similar to that of the fourth [invention, however] *inventive aspect. However*, the chip pad is divided into an [adhesive-applied] *adhesive application* portion (i.e., island portion) for adhering semiconductor chip and other portions ([annular] *peripheral* portion, lead portion, etc.).

[In the invention according] *According* to the present invention, it [through hole be] *is* desired that the [chip pad is] *through hole has a portion* tapered in the direction of its thickness such that the area of the [chip pad on the chip side] *opening end of the through hole in the chip-mounting* surface thereof[, as affected by the size of the through hole opening(s)] is [smaller] *greater* than the *through hole opening* area of the chip pad surface on the side opposite to the [chip side] *chip-mounting* surface. It is further desired to form a groove along the periphery of the island portion to prevent the [bonding agent] *adhesive* from flowing out.

Preferably, furthermore, the island portion should be lower than the [annular] *outer peripheral* portion on the chip-mounting side. In other words, it is desired that the [adhesive-mounting] *adhesive application* portion has a surface that is lower than the surface of the chip support portion so as to form a step therebetween.

It is further desired that a part of the surface of the [annular] *outer peripheral* portion on the chip-mounting surface of the chip pad be recessed relative to the remaining surface or surfaces of the [annular] *outer peripheral* portion on the chip-mounting surface. In other words, it is desired to form a dent in a portion for supporting the chip in the chip support portion of the chip pad.

The island portion may not necessarily be only one portion but may be divided into a plurality of portions. It is further desired that the island portion has a thickness smaller than that of other lead portions.

The aforementioned [modes] *features* may be suitably combined together as a matter of course.

To roughly find the stress in the plastic portion on the lower corner surface of the chip pad where the reflow cracks develop, the plastic portion under the chip pad should be modeled in the form of [an elongated] *a rectangular* flat plate which has [defined] *fixed* peripheral sides and on which the pressure is uniformly distributed as shown in FIG. 5. In this case, a maximum stress is generated at the center of the long side and is given by the following equation.

$$\sigma = \beta \cdot \frac{a^2}{h^2} p \quad (1)$$

where β denotes a coefficient of stress determined by the ratio of a long side to a short side, a denotes the length of the short side, h denotes the plate thickness, and p denotes a pressure of the water vapor.

As will be obvious from the equation (1), the stress that is generated increases in proportion to the square power of the chip pad size a. As the chip size increases, therefore, the reflow crack (designated at 10 in FIG. 6) tends to develop easily. To decrease the stress, therefore, the length of the short side should be shortened or the plate thickness should be increased. However, increase in the plate thickness results in the increase in the thickness of the package which is not adapted to flat packages that feature reduced thicknesses. Moreover, the chip pad size is not allowed to become smaller than the size of the chip, and is thus determined by the size of the chip.

According to the present invention, therefore, a plastic-holding portion is provided on a portion of the chip pad to divide the peeling portion of the chip pad. This helps substantially decrease the chip pad size a, [and] whereby stress in the plastic portion decreases and the reflow cracks are prevented from developing in the [resin] *plastic* portion.

According to the present invention, therefore, the distance for holding the plastic portion under the chip pad becomes short when the chip pad and the plastic portion are peeled off from each other, [and] *whereby* reduced stress develops in the [resin] *plastic* portion due to vapor pressure and reflow cracks are prevented from developing.

According to *one aspect of* the present invention, the chip and the chip pad are adhered together only at a central portion of the chip, and the stress that is generated in the chip is nearly equal to a value that results when the chip of a length that corresponds to the adhered portion is adhered over its entire mounting surface. Therefore, even those chips having large sizes do not develop cracks.

As for cracks that may develop in the [resin] *plastic* portion under the [lower end] *below edge* of the chip pad [through] *under* the temperature [cycle testing,] *cycling since* there exists a gap between the annular portion of chip pad and the island portion, [and] the [resin] *plastic material* introduced into this gap eliminates relative slippage between the plastic and the surface of the chip pad of the side opposite to the chip. Therefore, the stress is suppressed from developing at the lower portion of the chip pad, and the crack is prevented from developing in the plastic portion.

The coefficient of linear expansion of the plastic *material* is greater than that of the chip pad. Under a high-temperature condition at the time of reflow [solderin] *soldering*, therefore, the plastic [of a] portion [where] *in* the hole [is formed] is pushed onto the [side] *inner peripheral* surface of the [chip pad] *hole*. Moreover, since the [side] *inner peripheral* surface of the [chip pad] *hole* has been made rugged at the time when it was formed, the [side] *inner peripheral* surface of the [chip pad] *hole* prevents the plastic from swelling toward the lower side of the chip pad even in the case where the adhering force is insufficient between the plastic and the chip and, further, even when the vapor pressure is applied thereto. Here, the side surface of the island portion works as a fixed fulcrum. Therefore, the stress [being] generated is less than that [of] *in* the conventional [chip pad] *semiconductor device*, and [the] reflow cracks hardly develop.

As described above, the present invention provides a semiconductor device which prevents the chips from being destroyed at the time of die bonding and in the subsequent temperature aging, reduces the propensity for the formation of cracks in the plastic portion at the lower [end] *edge* of the chip pad [through] *under* the temperature [cycle testing becomes minimized] *cycling*, and exhibits excellent resistance to the formation of reflow cracks [becomes realizable].

According to the present invention, therefore, there is obtained a semiconductor device which does not permit semiconductor chips to be destroyed at the time of die bonding and in the subsequent temperature aging, the formation of cracks in the plastic portion at the lower end of the chip pad through the temperature cycle testing [becomes minimized], and *provides* excellent resistance to the formation of reflow cracks [becomes realizable].

DESCRIPTION OF THE PREFERRED EMBODIMENTS

The lead frame and semiconductor device according to embodiments of the present invention will now be described in conjunction with the drawings.

Figure 1:
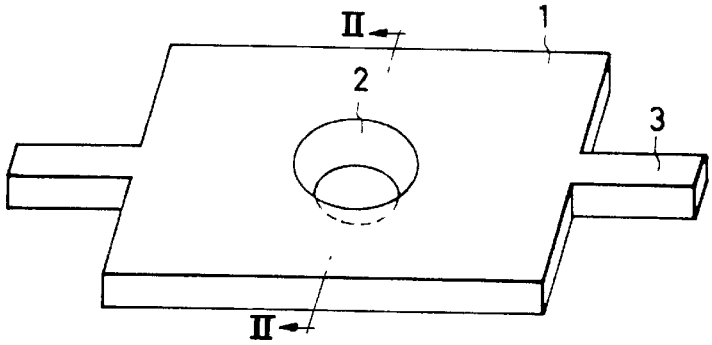
FIGS. 1 and 18 are perspective views [illustrating a portion] of [a] *chip pads of* lead [frame] *frames* according to [an embodiment] *different embodiments* of the present invention.
Figure 2:
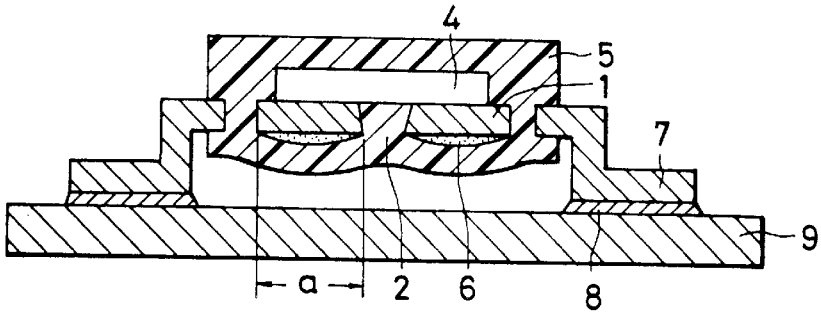
FIG. 2 is a [section] *sectional* view of a semiconductor device to which the embodiment of FIG. 1 is adapted, *taken along the line II-II in FIG. 1*.

FIG. 1 is a partial perspective view of the lead frame according to an embodiment of the present invention, and FIG. 2 is a [section] *sectional* view of a semiconductor device which employs the above lead frame.

According to this embodiment, a chip pad 1 is supported at its both ends by chip [pad-hanging] *pad supporting* leads 3 and has a through hole 2 formed nearly at the center thereof. As will be obvious from [a section view of] FIG. 2, the through hole 2 is gradually broadened toward a chip 4 and is gradually narrowed in a direction away from the chip 4. In FIG. 2, reference numeral 5 denotes a plastic portion, 6 denotes vapor, 7 denotes a [lead] *lead,* 8 denotes a solder, and 9 denotes a substrate.

Vapor 6 is generated on an interface between the chip pad 1 and the plastic portion 5. The plastic portion 5 is swollen as a result of the pressure of the vapor. In this case, stress is generated in the plastic portion 5 on the lower [corner surface] *edge* of the chip pad. According to this embodiment, however, the through hole 2 of the chip pad 1 holds the plastic portion 5, [and] *so that* the size [a] becomes smaller than one-half that of the conventional chip pad as will be obvious from the comparison of FIG. 2 with FIG. 6 (diagram of prior art). Therefore, the stress generated in compliance with the equation (1) can be reduced to less than one-fourth to prevent the occurrence of reflow cracks.

Figure 3:
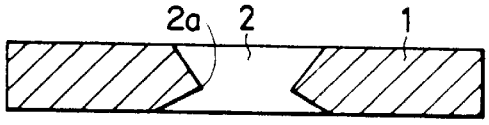
FIGS. 3 and 4 are [section] *sectional* views [illustrating portions] *of chip pads* of lead frames according to other embodiments of the present invention.
Figure 4:
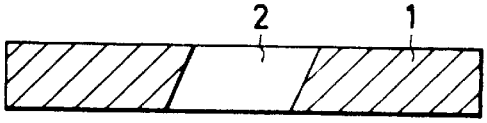
Figure 5:
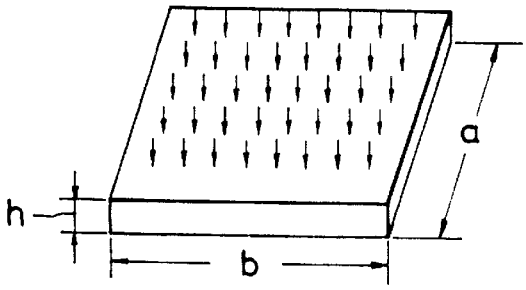
FIG. 5 is a perspective view of a calculation model used for calculating the stress in the lead frame.

Second and third embodiments of the present invention are illustrated in FIGS. 3 and 4. According to the second embodiment, a *restricted* portion *2a* having an area smaller than the area *of an opening end* of the through hole 2 [on] *in* the surface opposite to the chip[,] is formed in the through hole 2. According to the third embodiment, furthermore, the through hole 2 is formed *as* being tilted with respect to *the plane of* the chip pad 1. The through hole needs be tilted by about 10 degrees relative to the [orthogonal] direction [of] *normal to* the [chip-forming] *chip mounting* surface of the chip pad. In these two embodiments, the plastic portion enters [into] the through hole 2 so as to be held by the chip pad 1 to prevent the occurrence of reflow cracks [like] *as* in the first embodiment.

The through hole according to the present invention need not have a circular shape [on] *in* a plane as shown in FIG. 1, but may have an oval shape, a rectangular shape or a crossed shape to obtain the same effects. Moreover, the through holes may be formed in a [plurality of numbers] *plural number* so far as they do not impair the rigidity required for the chip pad 1[,] to obtain improved effects.

The stress $\sigma_h$ that is generated in the plastic portion in the through hole is expressed by, $$\sigma_h = \frac{A_t}{A_h} \cdot P \tag{2}$$

where $A_t$ denotes the area of the chip pad, and $A_h$ denotes a minimum area in the hole.

The plastic portion is destroyed when the stress exceeds a breaking stress of the plastic $\sigma_B$. Therefore, the following equation must hold, $$\sigma\beta > \frac{A_t}{A_h} P \tag{3}$$

and hence, $$A_h > \frac{P}{\sigma\beta} A_t \tag{4}$$

At the time of solder reflow, in general, the package is heated at about 220° C., and the [saturation] *saturated* vapor pressure of water at this temperature is 0.24 kgf/mm$^2$. Further, since the breaking stress of the plastic at this temperature is about 1 kgf/mm$^2$, these values are inserted in the equation (4) to obtain, $$A_h > 0.24 A_t \tag{5}$$

That is, the minimum area of the hole should be greater than 24% of the area *of the chip mounting surface* of the chip pad.

If the through hole becomes too great, the chip pad loses rigidity. Moreover, roughness is formed on the chip-mounting surface and it becomes difficult to join the chip [is made rugged wherein] *and* the chip pad together. Further, there is very little [conducting] *transfer of* heat applied from the surface of the chip pad of the side opposite the chip-mounting surface thereof to the chip at the time of wire bonding. Therefore, a limitation is imposed on the size of the through hole. According to experiments conducted by the present inventors, it was found that the through hole should have a surface opening area that is smaller than 80% of the area [corresponding to] *of the surface of* the chip that is to be mounted. The above-mentioned range of the *area of the* hole applies to each of the through holes of single hole chip pads or to the sum of the through holes of multi-hole chip pads.

Description below is how to form the through hole according to the present invention.

Figure 7:
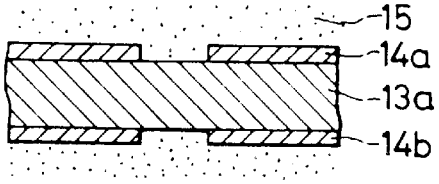
FIG. 7 (PRIOR ART)
FIGS. 7 and 8 are [section] *sectional* views [showing] *of* a [portion] *chip pad* of the lead frame to illustrate steps for forming a through hole in the lead frame according to prior art.
Figure 8:
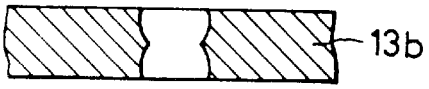
FIG. 8 (PRIOR ART)

FIG. 7 illustrates a method of forming a through hole in the chip pad according to the conventional etching technology. Etching patterns 14a and 14b of the same shape are tightly adhered onto both sides of [the] *a* chip pad *13a* which is then immersed in an etching solution 15. The etching proceeds from both surfaces of the chip pad *13a*, so that there is formed a hole that has a slightly narrower central portion as shown in FIG. 8. According to the conventional method, however, the area is nearly uniform inside the hole and, as a result of which, the plastic that enters [therein] *the hole* is not held by the hole.

Figure 9:
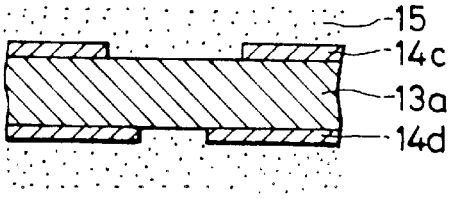
FIGS. 9. 10, 11, 12[,] *and* 14[, 19 and 21] are [section] *sectional* views illustrating [a portion of the lead frame to illustrate] steps for forming [a] through [hole] *holes* in the lead [frame] *frames* according to embodiments of the present invention.
Figure 10:
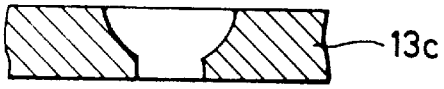

FIG. 9 illustrates a method of forming a through hole according to the second embodiment of the present invention. The opening of the hole in an etching pattern 14c on the upper surface of the chip pad *13a* is greater than the hole opening in an etching pattern 14d on the lower surface of the chip pad. When the chip pad is immersed in the etching solution 15, therefore, a hole is formed as shown in FIG. 10 [and] *so that* the second embodiment is realized.

Figure 11:
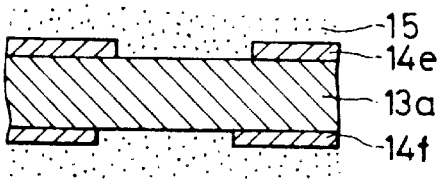
Figure 12:
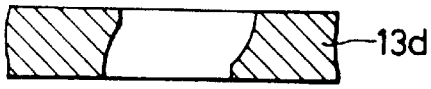

FIG. 11 illustrates a method of forming a through hole according to the third embodiment of the present invention. Etching patterns 14e and 14f have holes of [he] *the* same size but at different positions. The hole formed is characterized as being tilted relative to the chip pad surfaces as shown [n] *in* FIG. 12, [and] *so that* the third embodiment is realized.

Figure 13:
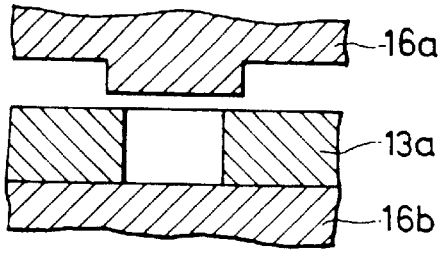
FIG. 13 is a [section] *sectional* view [illustrating portions] *of a chip pad* of [the] *a* lead frame and a pressing metal mold [to explain a step] for forming a through hole *therein*.
Figure 14:
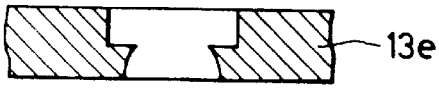

FIG. 13 illustrates a method of realizing the present invention relying upon a pressing action. First, a through hole is formed in the chip pad *13a* by a conventional technique, and a press metal mold *having a punch* 16a is pressed onto this portion *of the chip pad 13a placed on an anvil 16b*. Thus, there is provided a [portion] *through hole* opening having an area greater than the area [in the hole corresponding to] *of* a hole opening in the [chip-mounting] surface of the chip pad of the side opposite to the chip-mounting[,] surface [thereof] *thereof,* as shown in FIG. 14.

A fourth embodiment of the present invention will now be described in conjunction with FIGS. 15 and 16. [The] *Each* through hole *2* in the chip pad *1* is not tapered but has a diameter or width which is larger in the chip-mounting surface than a diameter or width in the surface opposite to the chip-mounting [side] *surface*. In this embodiment, furthermore, [a thin] *an enlarged* portion 17 is formed *in each hole 2*. Holes *2* are formed in a plural number. Reference numeral 18 denotes a die bonding material *or adhesive*.

Figure 15:
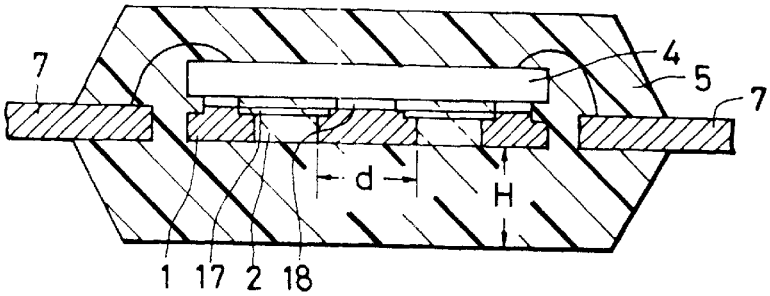
FIGS. 15, 16 and 17 are [section] *sectional* views of [semi-conductor] *semiconductor* devices according to further embodiments of the present invention.
Figure 16:
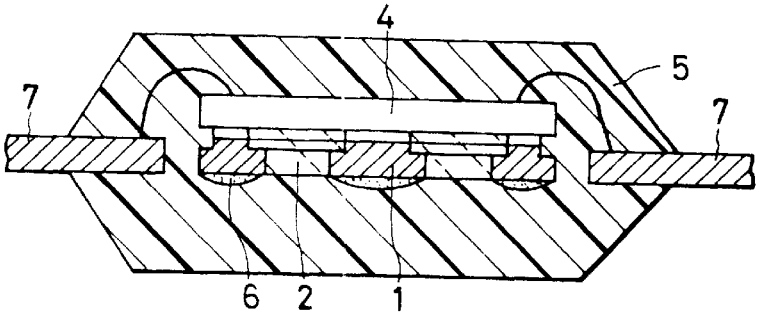

In FIG. 15, through holes 2 are formed in the chip pad 1, and [thin] *enlarged* portions 17 are *each* formed in the upper portion of the [chip pad 1] *hole 2*. According to this structure, the plastic portion 5 is molded onto the upper part of the chip pad even when a gap between the chip 4 and the chip pad 1 is completely filled with the die bonding material 18. Even [wen] *when* the chip pad 1 and the plastic portion 5 are peeled off from each other at the time of reflow soldering, the plastic portion 5 is not separated from the chip pad 1 owing to the plastic being molded on the *upper part of the* chip pad, and however, the plastic portion is *slightly* deformed by the vapor pressure as shown in FIG. 16. Here, if a maximum width d of a portion remaining on the chip pad is set to be smaller than a value given by the following equation, no crack develops in the [resin] *plastic* portion, i.e., $$d^2 = K_{IC} \frac{H^{\frac{3}{2}}}{\sqrt{3}} \cdot \frac{1}{p} \tag{6}$$

where $K_{1C}$: a breaking toughness of the [resin] *plastic* portion at a reflow temperature, p: a vapor pressure generated at the time of reflow.

Figure 17:
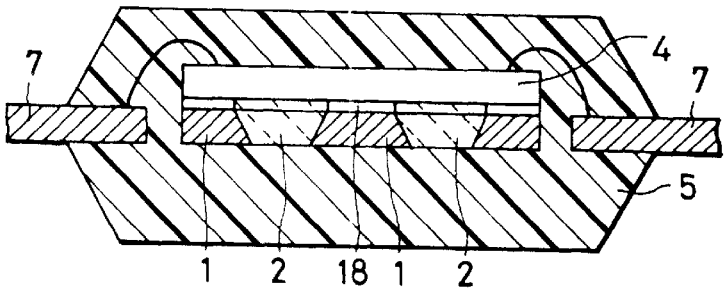
Figure 18:
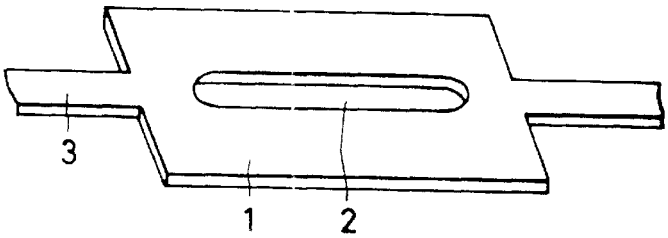

FIG. 17 illustrates a further embodiment in which through holes 2 that are upwardly [expanding] *diverging* are formed in a plural number to obtain *effects* similar [effects as] *to* those of the aforementioned embodiments. The through holes 2 may be of a circular shape but should preferably be of a shape close to a rectangular shape or close to an elongated circle as shown in FIG. 18 to obtain improved reinforcing effect.

Figure 19:
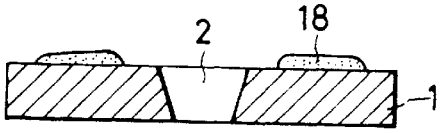
*FIG. 19 is a section view of a lead frame with an adhesive on a chip pad thereof;*
Figure 20:
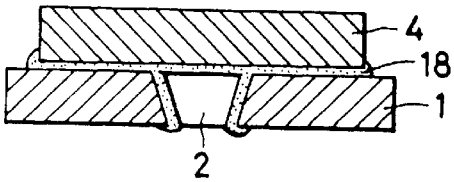
FIG. 20 is a [section] *sectional* view of the [state where an element is] *lead frame shown in FIG. 19 with a chip* mounted on the lead frame according to the embodiment of FIG. 19.

Finally, described below are problems involved in implementing the invention into practice and a method of solving the problems. FIG. 19 shows [that] *a* state where an adhesive 18 is applied to [join] *bond* the chip to the chip pad of the present invention, and FIG. 20 shows the state where the chip 4 is mounted and [joined] *bonded* after the state of [completion] FIG. 19. As shown in FIG. 20, when applied in an excess amount, the adhesive 18 may flow onto the [side] *inner peripheral* surface of the through hole 2. If the plastic portion is molded after the adhesive is hardened [under] *in* the state of FIG. 20, the plastic portion and the adhesive may peel off from each other to lose the effects of the present invention.

Figure 21:
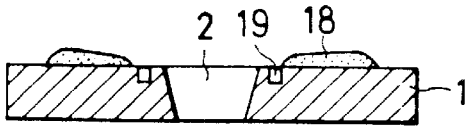
*FIG. 21 is a sectional view of a lead frame with a groove formed in a chip pad;*
Figure 22:
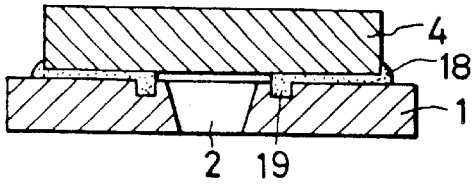
FIG. 22 is a [section] *sectional* view of the [state where] *lead frame shown in FIG. 21 with* a chip [is] mounted on the lead frame according to the embodiment of FIG. 21.

In order to solve such a problem, a groove 19 for preventing the overflow of adhesive 18 should be provided in the chip-mounting surface of the chip pad to surround the through holes *2* as shown in FIG. 21. FIG. 22 illustrates the state where the chip 4 is mounted on the chip pad 1 that is provided with the groove 19 for preventing the overflow of adhesive. As shown in FIG. 22, [an extra] *any excess* adhesive is prevented by the groove 19 from overflowing and does not flow into the through hole.

The following description of the embodiments for calculating the effects is based upon the presumption of using a 256 KDRAM package of the conventional construction having a chip size of 4.0 mm×9.0 mm, a chip pad size of 4.2 mm×9.3 mm, using a lead frame composed of a copper (Cu) alloy being die-bonded with a solder.

Figure 23:
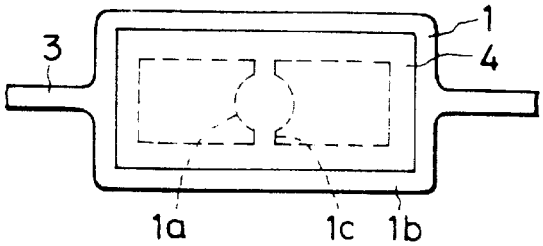
FIGS. 23, 26, 28, 30, 32 and 34 are plan views of chip [pad for semiconductor devices] *pads of lead frames* according to the embodiments of the present invention.

In FIG. 23, the semiconductor chip 4 is secured onto the chip pad 1 using an adhesive, and terminals on the semiconductor chip 4 are electrically connected through fine metal wires to a plurality of leads 7 arranged around the chip pad 1. The lead frame consists of leads that include chip [pad-hanging] *pad supporting* leads *3* (*FIG. 1*) and the chip pad 1, and is sealed with the [resin] *plastic* portion 5 and is then cut away from the outer frame to which it had been coupled.

The semiconductor chip 4 is composed of silicon (Si) whose coefficient of linear expansion $\alpha$ is about $3\times10^{-6}$/° C. The lead frame is usually composed of a 42 alloy (*Fe-42Ni*) ($\alpha=5\times10^{-6}$/° C.) or a copper alloy ($\alpha=17\times10^{-6}$/° C.). The plastic 5 has a coefficient of linear expansion $\alpha$ of 20 to $30\times10^{-6}$/° C. In this embodiment, the chip pad 1 [is divided into] *has* a *generally circular* central island portion 1a and [a] *an outer* peripheral [annular] portion 1b. Symbol 1c denotes leads [the] *to* couple the island portion 1a and the [annular] *peripheral* portion 1b together. As is obvious from FIG. 24, furthermore, the adhesive 18 is applied onto the island portion 1a only.

In the conventional semiconductor device, the constituent materials have dissimilar coefficients $\alpha$ of linear expansion. Therefore, the chips constructed in a large size are accompanied by such problems as cracking resulting from the step of die bonding for [joining] *mounting* the chip [and] *on* the chip pad [together] or due to temperature aging after the die bonding and cracking in the plastic at the lower edge of the chip pad due to cooling after the semiconductor device is sealed with plastic or due to temperature cycle testing. Furthermore, if [the] *a* semiconductor device left to stand in the air for extended periods of time is mounted on the surface of [the] *a* substrate, cracks often develop in the plastic (hereinafter referred to as crack [in] *during* the solder reflow). Contents of the defective modes will now be described.

The thermal stress is generated at the time of die bonding since the semiconductor chip and the chip pad material have dissimilar coefficients of linear expansion. If the adhesive yields, therefore, tensile stress results on the surface of the [element] *chip* due to temperature aging after the die bonding.

Figure 35:
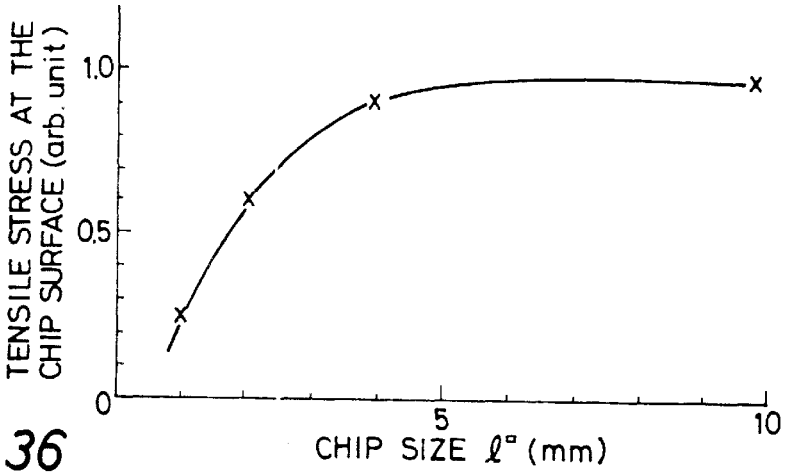
FIG. 35 is a diagram showing stress [on] *in* the chip surface.

In the case of the copper (Cu) lead frame and the adhesive composed of a 95 Pn-5 Sn solder, the tensile stress becomes as shown in FIG. 35. The tensile stress increases with the increase in the chip size, and often exceeds the breaking strength of the chip. It is therefore attempted to use a lead frame material of the Fe-Ni type having a small coefficient of expansion and to use a die bonding agent having a very small elasticity, to decrease the stress that results in the chip.

Figure 36:
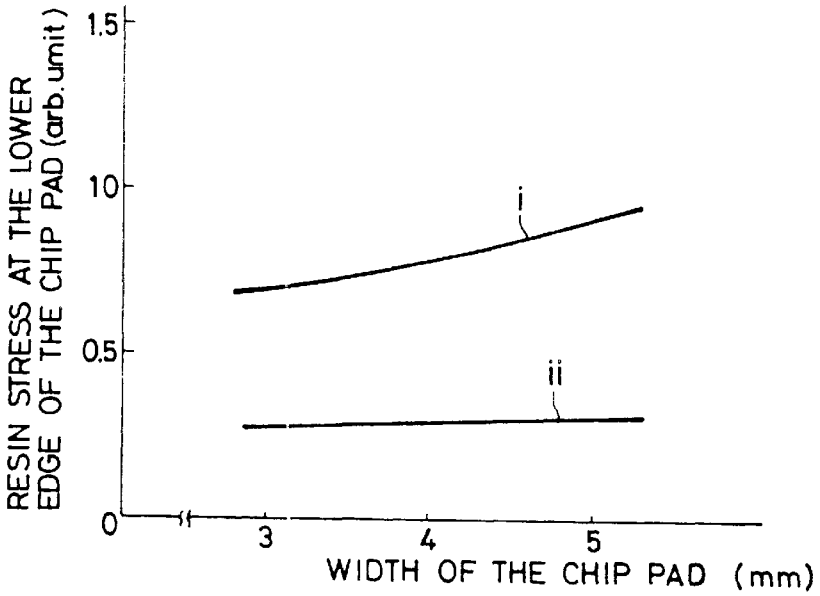
FIG. 36 is a diagram showing resin stress at the lower edge of the chip pad.

The cracks develop in the plastic at the lower corner of the chip pad during the temperature [cycle testing] *cycling* since the stress developed is concentrated at the lower corner of the chip pad due to difference in the coefficient of linear expansion between the lead frame material and the plastic material. In particular, if the plastic peels off from the chip pad of the side opposite to the chip, the stress at the lower corner of the chip pad increases stepwisely as shown in FIG. 36. The stress increases so rapidly with the increase in the chip pad [siz] *size* (chip size) that cracks develop in the plastic. A curve i represents peeling between the chip pad and the plastic, which exhibits relative slippage, and a curve ii represents whole-surface adhesion without relative slippage. To prevent the cracks from developing in the plastic at the lower corner of the chip pad, holes are formed (referred to as dimple formation) in the chip pad on the side opposite to the chip, and the plastic is charged into the holes thereby preventing the relative slippage caused by the peeling between the chip pad and the plastic portion.

To mount the semiconductor device on the substrate practically, the solder connection portion of the lead and the connection portion of the substrate are tentatively adhered together with a solder paste or the like, and the whole substrate is heated up 200° to 250° C. for several tens of seconds to several minutes, for example, by an infrared ray reflow equipment or by a vapor phase reflow equipment. The semiconductor device is thus joined with the solder and is mounted on the substrate. This is called a reflow soldering process.

In fact, however, cracks develop in the plastic during the reflow soldering process if the above-mentioned reflow is carried out using the semiconductor device that is left to stand in the atmosphere for extended periods of time or using the semiconductor device that is preserved in an [environement] *environment* having a relatively high humidity even for a short period of time.

This is due to the following reasons. That is, the plastic absorbs moisture in the air while the semiconductor device is being preserved, and the moisture remains in the plastic or in a small gap between the plastic portion and the surface of the chip pad on which the plastic is adhered. If the semiconductor device that has absorbed moisture is subjected to the reflow soldering process, the moisture on the interface between the plastic and the chip pad turns into vapor and expands due to quick heating, and [a] *an* excessive stress is generated in the plastic as a result of the vapor pressure. Even if there is no moisture on the interface of adhesion, the moisture contained in the plastic diffuses and is condensed on the interface of adhesion giving rise to the generation of stress in the plastic in a manner as described above.

Figure 6:
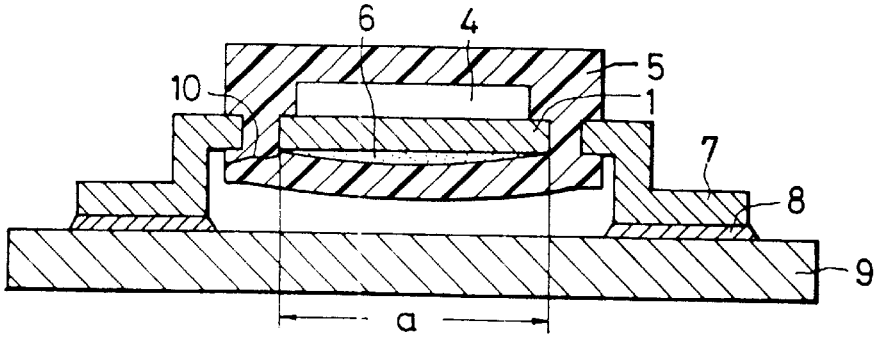
FIG. 6 (PRIOR ART)
FIG. 6 is a [section] *sectional* view of a semiconductor device according to prior art.

Thus, there develop reflow cracks as designated at 10 in FIG. 6.

Figure 24:
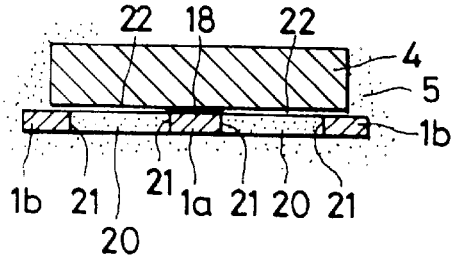
FIG. 24 is a [section] *sectional* view of FIG. 23.

According to [this] *the* embodiment [as] shown in FIGS. 23 and 24, however, the chip pad 1 [is divided into an] *has a generally circular* island portion 1a and an [annular] *outer peripheral* portion 1b. At the time of die bonding, therefore, the adhesive *18* is applied to the island portion 1a only, and the [annular] *outer peripheral* portion 1b plays the role of a stabilizer plate for stably placing the chip on the chip pad 1. First, discussed below is an effect for improving chip cracks that in many cases develop at the center of the long side of the chip. Therefore, if it is presumed that the [long side] *chip* has a size of 9 mm [□] *square* which is a representative size of the chip and if the chip is adhered over a central area of 2 mm [□] *square* only, then the stress that is generated [is] in the chip can be reduced to 60% [in light] of *the value shown in* FIG. 35, compared with that of the conventional chip that is adhered over its entire surface.

After the die bonding, the package is prepared through the step of molding. Next, discussed below are cracks that develop in the plastic at the lower corner of the chip pad due to the temperature cycle testing. The plastic cracks at the lower corner of the chip pad develop in many cases at the center [in] *of* the [short] *long* side of the chip pad. Therefore, a chip pad width of 4.2 mm is selected. In FIG. 36, the chip pad is presumed to have a width of 4.2 mm. If the relative slippage is eliminated according to the embodiment of the invention, then the plastic stress at the lower edge of the chip pad can be reduced to 38% compared with that of [when there exists] *the prior art in which* a relative slippage *occurs* between the chip pad on the side opposite to the chip and the plastic of the prior art.

Finally, the effect for the reflow soldering is calculated. In using the conventional chip pad having a size of 4.3 mm×9.3 mm, it is presumed that the back surface of the chip and the plastic interface are peeled off from each other in the embodiment of the invention, the length of the short side of the peeled portion being 2.4 mm, and the length of the long side being 2.6 mm. In compliance with the equation (1), therefore, B=0.5 and a=4.2 mm in the case of the conventional chip pad, and B=0.33 and a=2.4 mm in the case of the chip pad of the embodiment of the invention. According to the embodiment of the present invention, therefore, a maximum stress $\sigma_{max}$ of the semiconductor devices decreases to about 22% compared with that of the conventional device. If the breaking strength of the plastic remains the same, resistance against the pressure increases by 4.6 times.

According to the embodiment of the invention [as] described above, the strength can be strikingly increased against the propensity for chip cracks, against plastic cracks at the lower corner of the chip pad caused by the temperature [cycle testing] *cycling*, and against reflow cracks.

As for the plastic cracks at the lower corner of the chip pad caused by the temperature [cycle testing] *cycling*, the relative slippage between the chip pad of the side opposite to the chip and the plastic is prevented by the plastic 20 that is charged into the [portions] *holes* formed by punching the chip pad. Therefore, generation of the stress can be suppressed at the lower corner of the chip pad, and plastic cracks are prevented from developing.

The coefficient of linear expansion of the plastic is greater than that of the chip pad. When subjected to a high temperature at the time of reflow soldering, therefore, the plastic being charged into perforated portions as designated at 20 in FIG. 24 is pressed onto the [side] *peripheral* surfaces 21 of the *holes in the* chip pad. Moreover, since the [side] *peripheral* surfaces of the chip pad prepared have been made rugged, the [side] surfaces of the chip pad designated at 21 in FIG. 24 prevent the plastic from swelling toward the lower side of the chip pad even in the case where the [adhesive] *bonding* force is insufficient between the plastic designated at 22 in FIG. 24 and the chip. In FIG. 24, the [side] *peripheral* surfaces 21 serve as fixed fulcrums. Therefore, the length a in the equation (1) becomes sufficiently small compared with that of the conventional chip pad, generation of the stress is further suppressed, and increased resistance is exhibited against the reflow cracks.

Figure 25:
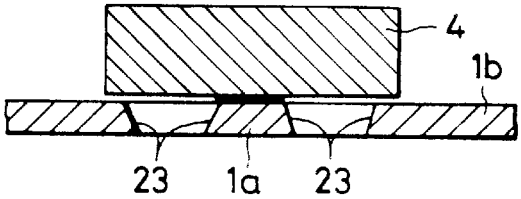
FIG. 25 is a [section] *sectional* view of a chip pad [for a semiconductor device] *of a lead frame* according to an embodiment of the present invention.
Figure 26:
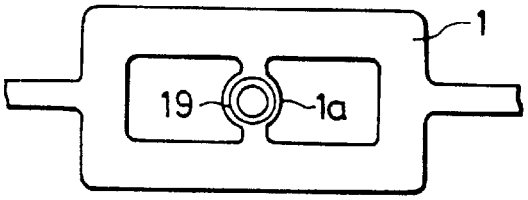

FIGS. 25 to 34 illustrate further embodiments. Referring to FIG. 25, the chip pad is tapered in the direction of the thickness thereof as designated at 23 to more reliably prevent propensity for the plastic from swelling beyond the chip pad. Referring to FIG. 26, a groove 19 is formed [to surround the adhesive-mounting] *in the island* portion *1a* to prevent the adhesive from flowing out. The groove should have a size of, for example, about 0.2 mm in width and 0.2 mm in depth.

Figure 27:
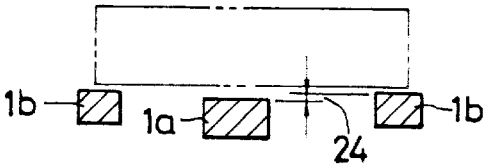
FIG. 27 is a [section] *sectional* view of FIG. 28.
Figure 28:
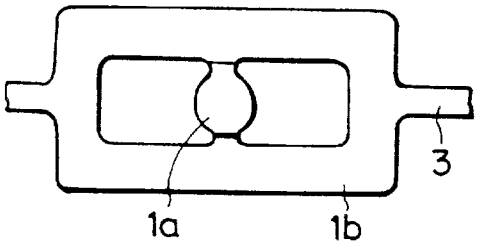

Referring to FIGS. 27 and 28, a step 24 of a height δ is provided between the surface of the [chip support] *island* portion *1a* and the surface of the [adhesive-mounting] *outer peripheral* portion *1b*. This makes it possible to minimize the gap between the chip and the [chip support] *outer peripheral* portion *1b*. The height δ should be from about 10 μm to about 50 μm.

Figure 29:
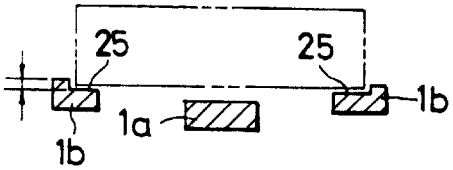
FIG. 29 is a [section] *sectional* view of FIG. 30.
Figure 30:
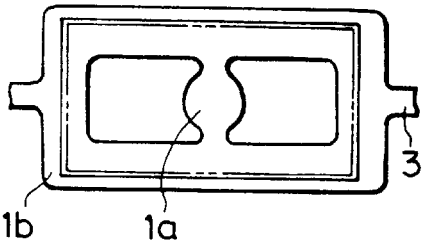

Referring to FIGS. 29 and 30, a dent 25 is formed in a portion of the [chip support] *outer peripheral* portion *1b* for supporting the chip, to facilitate the positioning of the chip.

Figure 31:
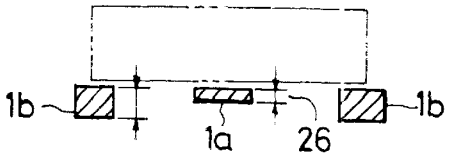
FIG. 31 is a [section] *sectional* view of FIG. 32.
Figure 32:
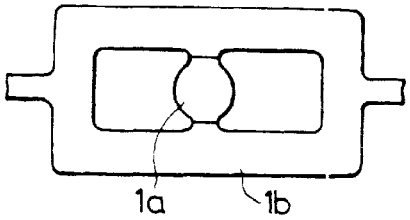

With reference to FIGS. 31 and 32, the lead of the [adhesive-mounting] *island* portion *1a* has a thickness 26 smaller than the thickness of the [support] portion *1b*. This makes it possible to further decrease the stress that generates in the chip.

Figure 33:
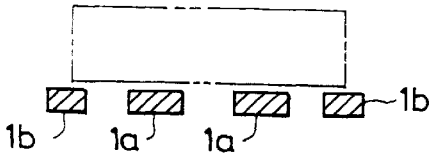
FIG. 33 is a [section] *sectional* view of FIG. 34.
Figure 34:
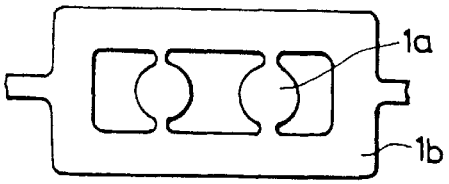

With reference to FIGS. 33 and 34, there are provided two [chip mounting] *island* portions *1a*. In this way, the [chip-mounting] *island* portions *1a* may be provided in a plural number as required.

The aforementioned embodiments may be put into practice individually or in suitable combinations.

According to the aforementioned embodiments, only a central portion of the chip is [joined in die-bonding the chip and] *bonded to* the chip pad [together]. Therefore, the stress that is generated in the chip as a result of the die bonding or as a result of the subsequent temperature aging is suppressed, and the chip is prevented from breaking.

Since the plastic is charged into a *through* hole formed in the chip pad to form a protrusion of the plastic, there develops no relative slippage in the adhering portion between the plastic and the chip pad [of] *on* the side *thereof* opposite to the chip. Therefore, the plastic stress that would otherwise result at the lower edge of the chip pad decreases significantly, [and] *so that* the life of the device increases greatly against the temperature cycle.

Furthermore, since [side surfaces] *an inner peripheral surface* of the *through* hole formed in the chip pad prevent the plastic from swelling despite the vapor pressure at the time of reflow soldering, the resistance increases greatly against the reflow cracks.

What is claimed is:

1. In a lead frame comprising a unitary structure of a chip pad for mounting a semiconductor chip on a chip-mounting surface thereof and [a group of] *chip pad supporting* leads connected to said chip pad [along said chip pad], the improvement wherein a through hole is formed in at least a portion of said chip pad, said through hole [being projected in a direction which] *having an inner peripheral surface at least a part of which* is tilted relative to a direction [from] *normal to* the plane of the chip-mounting surface of said chip pad.

2. A lead frame according to claim 1, wherein said through hole in its entirety is tilted relative to a direction of thickness of said chip pad.

3. A lead frame according to claim 1, wherein said through hole is characterized as having a relatively narrower opening within the chip pad itself than at either the chip-mounting surface through hole opening end or at the through hole opening end at an opposing surface thereof.

4. A lead frame according to claim 1, wherein said through hole has an [area on] *opening end in* the chip-mounting surface of said chip pad [that lies over a range of from 24% of the area of the chip-mounting surface of the entire chip pad itself to], *said opening end being of an area less than* 80% of the actual chip-mounting surface area required [of said chip pad to which] *for* said semiconductor chip [is] *to be* adhered [to] *thereto, and said through hole has a minimum opening area greater than 24% of the area of said chip-mounting surface*.

5. A lead frame according to claim 1, wherein a groove is formed in the chip-mounting surface of said chip pad to surround the through hole.

6. In a lead frame comprising a unitary structure of a chip pad for mounting a semiconductor chip on a chip-mounting surface thereof, and [a group of] *chip supporting* leads connected to said chip pad [along said chip pad], the improvement wherein a through hole is formed in at least a portion of said chip pad, said through hole having [an] *a first* opening [on] *end in* the chip-mounting surface of said chip pad [that is], *said first opening end being* greater in area than [the area corresponding to an] *a second* opening [thereof on] *end of said through hole in* a surface of said chip pad [opposing] *opposite to* the chip-mounting surface thereof.

7. A lead frame according to claim 6, wherein the area of said *first opening end of said* through hole [corresponding to an opening on] *in* the chip-mounting surface of said chip pad [lies over a range of from 24% of the chip-mounting surface of the entire chip pad itself to] *is less than* 80% of the actual chip-mounting surface area required [of said chip pad to which] *for* said semiconductor chip [is] *to be* adhered [to] *thereto, and the area of said second opening end is greater than 24% of the area of said chip-mounting surface*.

8. A lead frame according to claim 6, wherein a groove is formed in the chip-mounting surface of said chip pad to surround the through hole.

9. In a semiconductor device comprising a semiconductor chip, a chip pad having a chip-mounting surface for mounting said semiconductor chip, a group of leads *electrically* connected to said chip [pad as a unitary structure along said chip pad,] *and having* inner [leads disposed within said group of leads] *ends*, and a plastic portion for sealing the semiconductor chip, *said chip pad and said inner leads*, the improvement wherein a through hole is formed in at least a portion of said chip pad, said through hole [being projected in a direction] *having an inner peripheral surface at least a part of* which is tilted relative to a direction [from] *normal to* the plane of the chip-mounting surface of said chip pad.

10. A semiconductor device according to claim 9, wherein said through hole in its entirety is angularly tilted with respect to the direction of thickness of said chip pad.

11. A semiconductor device according to claim 9, wherein said through hole is characterized as having a relatively narrower opening within the thickness of the chip pad itself than at either the chip-mounting surface through hole opening end or at the through hole opening end at an opposing surface thereof.

12. A semiconductor device according to claim 9, wherein said through hole has an opening [on] *end in* the chip-mounting surface of said chip pad, *said opening end being* of an area that is greater than the area of an opening *end* of said through-hole [on] *in* the surface of said chip pad [opposing] *opposite to* the chip-mounting surface thereof.

13. A semiconductor device according to claim 9, wherein said through hole has [an area on] *a first opening end in* the chip-mounting surface of said chip pad [that lies over a range of from 24% of the chip-mounting surface of the entire chip pad itself to], *said first opening end being of an area smaller than* 80% of the actual chip-mounting surface area required [of said chip pad to which] *for* said semiconductor chip [is] *to be* adhered [to] *thereto, and said through hole has a second opening end disposed in the surface of said chip pad opposite to said chip-mounting surface and having an area greater than 24% of the area of said chip-mounting surface.*

14. A semiconductor device according to claim 9, wherein a groove is formed in the chip-mounting surface of said chip pad to surround said through hole.

15. In a semiconductor device comprising a semiconductor chip, a chip pad having a chip-mounting surface for mounting said semiconductor chip, and a group of leads inclusive of *pad supporting* leads that are linked to said chip pad to hold it, the improvement wherein said chip pad [is divided into a] *has an outer* peripheral [annular] portion [thereof] and a central island portion, said island portion [thereof] being linked to a part of said [annular] *outer peripheral* portion thereby resulting in a unitary [structure] *structure,* wherein [it] *said semiconductor chip* is supported by said [annular] *outer peripheral* portion, said semiconductor chip being indirectly mounted on said island portion via an adhesive and being further mounted on the chip-mounting surface of said [annular] *outer peripheral* portion via a gap.

16. A semiconductor device according to claim 15, wherein said chip pad has sides that are tapered in the direction of thickness thereof such that the area thereof on the chip-mounting surface is less than the area of the surface of said chip pad opposing the chip-mounting surface thereof.

17. A semiconductor device according to claim 15, wherein a groove is formed [to surround] *in* said island portion in order to prevent [a bonding agent which is used as an] *said* adhesive [for mounting] from flowing out *of said island portion.*

18. A semiconductor device according to claim 15, wherein said island portion is recessed relative to said [annular] *outer peripheral* portion on the chip-mounting surface of said chip pad.

19. A semiconductor device according to claim 15, wherein a part of the surface of said [annular] *outer peripheral* portion on the chip-mounting surface of said chip pad is recessed with respect to the remaining surface *portion* of the [annular] *outer peripheral* portion of the chip-mounting surface.

20. A semiconductor device according to claim 15, wherein said island portion is divided into a plurality of portions.

21. A semiconductor device according to claim 15, wherein said island portion is thinner than said annular portion or is thinner than any lead of said group of leads.

22. In a semiconductor device comprising a semiconductor chip, a chip pad having a chip-mounting surface for mounting said semiconductor chip thereon, and a group of leads inclusive of *pad supporting* leads that are linked to said *chip* pad to hold it, the improvement wherein said chip pad is divided into an [annular] *outer peripheral* portion and a central island portion, said island portion being linked to a part of said [annular] *outer peripheral* portion thereby resulting in a unitary [portion] *structure*, said semiconductor chip being indirectly mounted on said island portion via an adhesive and being further mounted on the chip-mounting surface of said [annular] *outer peripheral* portion directly.

23. A semiconductor device according to claim [15] *22*, wherein said island portion is thinner than said [annular] *outer peripheral* portion and is thinner than any lead of said group of leads.

*24. A semiconductor device comprising:*

*a chip pad having substantially parallel first and second surfaces,*

*a semiconductor chip mounted on said first surface of said chip pad to form an assembly and having a first surface facing said chip pad and a second surface remote from said chip pad;*

*a group of leads including chip pad supporting leads connected to said chip pad to support the same; and*

*an enclosure of a plastic material encasing said assembly, said enclosure including a first portion disposed in contact with said second surface of said semiconductor chip and a second portion disposed in contact with said second surface of said chip pad and integrally connected to said first portion of said enclosure to hold said semiconductor chip and said chip pad together;*

*said chip pad having formed therein at least one through hole extending through a thickness of said chip pad and having first and second opening ends in said first and second surfaces of said chip pad, respectively:*

*said first opening end of said through hole facing said first surface of said semiconductor chip;*

*said plastic enclosure further including a third portion integral with and extending from said second portion thereof through said through hole in said chip pad toward said semiconductor chip;*

*said through hole being so shaped so as to hold said third portion of said enclosure against a force which tends to move said third portion of said plastic enclosure relative to said chip pad away from said semiconductor chip.*

*25. A semiconductor device according to claim 24, wherein said through hole has an inner peripheral surface at least a part of which is inclined to a direction normal to a plane of the first surface of said chip pad.*

*26. A semiconductor device according to claim 24, wherein said first opening end of said through hole is larger in area than said second opening end.*

*27. A semiconductor device according to claim 26, wherein said through hole is convergent from said first opening end toward said second opening end.*

*28. A semiconductor device according to claim 24, wherein said through hole has a narrowed portion between said first and second opening ends, said narrowed portion having a cross-sectional area less than a cross-sectional area of said first opening end.*

*29. A semiconductor device according to claim 24, wherein said through hole has an axis inclined to a direction normal to a plane of said first surface of said chip pad.*

*30. A semiconductor device according to claim 24, wherein said semiconductor chip is mounted on said first surface of said chip pad with a layer of an adhesive interposed therebetween.*

*31. A semiconductor device according to claim 30, wherein said chip pad is provided with means for preventing said adhesive from flowing from said first surface thereof into said through hole comprising a groove formed in said first surface of said chip pad and extending around said first opening end of said through hole.*

*32. A semiconductor device according to claim 24, wherein the area of said second opening end of said trough hole is greater than 24% of the area of said first surface of said chip pad, and the area of said first opening end of said through hole is less than 80% of the area of said first surface of said semiconductor chip.*

*33. A semiconductor device comprising:*

*a chip pad having substantially parallel first and second surfaces;*

*a semiconductor chip mounted on said first surface of said chip pad to form an assembly and having a first surface facing said chip pad and a second surface remote from said chip pad;*

*a group of leads including chip pad supporting leads connected to said chip pad to support the same, said chip pad having formed therein at least one through hole extending through a thickness of said chip pad and dividing said chip pad into at least one island portion and an outer peripheral portion, said island portion being connected to a part of said outer peripheral portion and having a first surface facing said semiconductor chip and a second surface remote from said semiconductor chip, said outer peripheral portion having a first surface supporting thereon said semiconductor chip and a second surface remote from said semiconductor chip; and*

*a layer of an adhesive interposed between said semiconductor chip and said first surface of said island portion.*

*34. A semiconductor device according to claim 33, wherein said through hole has an inner peripheral surface which is so shaped that said first surface of said outer peripheral portion of said chip pad is less in area than an area of said second surface of said outer peripheral portion of said chip pad.*

*35. A semiconductor device according to claim 33, wherein a groove is formed in said first surface of said island portion along an outer periphery thereof to prevent said adhesive from flowing from said first surface of said island portion into said through hole.*

*36. A semiconductor device according to claim 33, wherein said first surface of said island portion is off set from said first surface of said outer peripheral portion in a direction away from said semiconductor chip.*

*37. A semiconductor device according to claim 33, wherein a recess is formed in an inner peripheral zone of said first surface of said outer peripheral portion of said chip pad.*

*38. A semiconductor device according to claim 33, wherein said island portion is thinner than said outer peripheral portion.*

*39. A lead frame structure comprising:*

*a chip pad having substantially parallel first and second surfaces, said first surface being adapted to receive thereon a semiconductor chip to support the same; and*

*a group of leads including chip pad supporting leads connected to and integral with said chip pad to support the same;*

*said chip pad having formed therein at least one through hole extending through a thickness of said chip pad and having first and second opening ends in said first and second surfaces of said chip pad, respectively;*

*said through hole having an inner peripheral surface at least a part of which is inclined relative to a direction normal to a plane of said first surface of said chip pad.*

*40. A lead frame structure comprising:*

*a chip pad having substantially parallel first and second surfaces, said first surface being adapted to receive thereon a semiconductor chip to support the same; and*

*a group of leads including chip pad supporting leads connected to and integral with said chip pad to support the same;*

*said chip pad having formed therein at least one through hole extending through a thickness of said chip and having first and second opening ends in said first and second surfaces of said chip pad, respectively;*

*said first opening end of said through hole being larger in area than said second opening end.*

*41. A lead frame structure according to claim 40, wherein said through hole is convergent from said first opening end toward said second opening end.*

*42. A lead frame structure comprising:*

*a chip pad having substantially parallel first and second surfaces, said first surface being adapted to receive thereon a semiconductor chip to support the same; and*

*a group of leads including chip pad supporting leads connected to and integral with said chip pad to support the same;*

*said chip pad having formed therein at least one through hold extending through a thickness of said chip pad and having first and second opening ends in said first and second surfaces of said chip pad, respectively;*

*said through hole having a restricted portion disposed between said first and second opening ends;*

*said restricted portion having a cross-sectional area smaller than an area of said first opening end.*

*43. A lead frame structure according to claim 39, wherein said through hole has an axis inclined to a direction normal to a plane of said first surface of said chip pad.*

*44. A lead frame structure according to claim 39, wherein a groove is formed in said first surface of said chip pad around said first opening end of said through hole.*

*45. A lead frame structure according to claim 39, wherein the area of said first opening end of said through hole is less than 80% of an area required for said semiconductor chip to be adhered to said first surface of said chip pad, and the area of said second opening end of said through hole is greater than 24% of an entire area of said first surface of said chip pad.*

*46. A semiconductor device according to claim 24, wherein said through hole is of an elongated shape.*

*47. A lead frame structure according to claim 39, wherein said through hole is of an elongated shape.*

*48. A lead frame structure according to claim 40, wherein said through hole is of an elongated shape.*

* * * * *